United States Patent
Khoury et al.

[11] Patent Number: 5,867,778
[45] Date of Patent: Feb. 2, 1999

[54] SWITCHED GAIN ELEMENT

[75] Inventors: George Khoury; Adrian John Bergsma, both of Ottawa, Canada

[73] Assignee: Northern Telecom Limited, Montreal, Canada

[21] Appl. No.: 997,784

[22] Filed: Dec. 24, 1997

[51] Int. Cl.[6] .................................................. H04B 1/28
[52] U.S. Cl. ..................... 455/333; 455/326; 455/341; 330/254; 330/273; 327/359
[58] Field of Search ............................... 455/333, 232.1, 455/234.1, 239.1, 249.1, 253.2, 291, 293, 311, 323, 325, 326, 341, 318–320, 330, 252.1; 330/250, 252–253, 254, 278, 286, 307, 73; 327/359, 120, 121

[56] References Cited

U.S. PATENT DOCUMENTS 4,480,337  10/1984  Graziadei et al. ......................... 455/333
5,630,228   5/1997  Mittel ......................................... 455/333

*Primary Examiner*—Doris H. To

[57] ABSTRACT

A switched gain element has an input differential transistor pair and a gain control stage formed of a transistor quad. The four transistors of the transistor quad are connected through respective impedances to a supply voltage. The junction of the impedances and the transistors are connected through further respective transistors to output terminals. The further transistors are switched on by respective control voltages applied to switchable current sources. The same control voltages are applied to the transistor quad. Thus, when first predetermined voltages are applied a first voltage corresponding to the value of two of the impedances is output and when second predetermined voltages are applied a second voltage corresponding to the value of the remaining two impedances is output. The invention may also be applied to a mixer for switching the gain.

23 Claims, 13 Drawing Sheets

SWITCHED GAIN ELEMENT

FIELD OF THE INVENTION

This invention relates to a switched gain element particularly but not exclusively applicable to integrated circuits.

BACKGROUND OF THE INVENTION

Most communication systems in use today consist of a transmitting station and a receiving station connected by a channel which can be free space (wireless), fibre optic cable, coaxial cable or copper wire.

To improve performance and to optimize the use of a given type of channel, the information signal is usually translated to a higher frequency to be transmitted, sent into the channel and then translated back to a lower frequency to be received. The channel normally exhibits characteristics that degrade the transmission of the signal such as fading, attenuation, additional noise and interference from other sources or other users of the channel.

The transmitter and receiver can be made adaptable to aid in reducing the effects of detrimental channel characteristics by employing circuit components with variable characteristics.

In the transmitter, a variety of transmit power levels should be available to allow the use of increased transmit power when required, relying on the lowest possible transmit power to ensure a reliable signal at the receiver while minimizing power consumption. These additional power levels should not require significantly more power or circuit complexity to implement than a comparable single power level system, nor affect the linearity of the system as the power level is changed.

In a receiver, channel variations such as fading can be adjusted for by increasing the gain in the receiver. However, large signals that are near in frequency to the desired signal can then overload the amplifier or mixer and block all reception. A solution for this is to use a variable gain selection stage early in the receiver to allow maximum gain without overload to ensure maximum dynamic range and ensure proper reception of the desired signal. Variable gain blocks can also be used in front of the demodulator or decision block to ensure a constant input signal level which is useful for decreasing the probability of reception error.

In a transmitter, the power control and frequency translation functions are usually done separately. The power control is often done in the final power amplifier or in a preceding driving amplifier, both of which require significant design effort to maintain linearity and spectral purity of the signal over a wide range of transmit powers. If the power control is done at a lower frequency, increased design effort is required in or before the frequency translation stage, often requiring increased power consumption to maintain linearity.

In a receiver, the power or gain control and the frequency translation functions are usually done separately as well. Usually the gain control is done as close as possible to the antenna to reduce the design effort required in the subsequent circuitry. This, however, often requires significant power consumption and design complexity to maintain a high dynamic range. In addition, it is greatly preferred that the transfer curve of any automatic gain control (AGC) block be linear, which can be difficult to achieve without complex circuitry.

SUMMARY OF THE INVENTION

It is an object of the present invention to provide a switched gain element which obviates or mitigates the above identified problems.

This invention circumvents these design problems by providing a means to produce a variable gain circuit with well defined, selectable gain settings. The circuit is designed with as many loads as dictated by the gain range and step size, each individually accessible by a controlling switching signal, usually provided by a digital controller. The desired gain is selected by switching the desired load and corresponding output cell into the signal path, while disabling all other loads and output cells. In this manner, power usage is kept constant across a wide variety of well defined loads providing a range of well defined gains, no reduction in linearity, no increase in noise and a minimal increase in design complexity.

In summary the invention provides a switched gain element comprising an input stage for receiving an input signal and a gain control stage connected to the input stage, the gain control stage comprising: at least one plurality of switch transistors connected respectively to a plurality of load impedance of different values; the switch transistors having respective control terminals whereby application of predetermined respective control voltages to the control terminals causes selectively a predetermined one of the plurality of switch transistors to conduct thereby causing a voltage dependent on the respective impedance to be derived at an output of the predetermined switch transistor, the outputs of the plurality of switch transistors being connected through respective buffer switches to an output terminal, the buffer switches being switchable by the respective control voltages whereby the derived voltage is applied to the output terminal.

The invention is primarily intended to be implemented as a monolithic integrated circuit. This invention consumes less current and less chip area than conventional blocks of this type. It can be implemented in a standard silicon Bipolar Junction Transistor technology without requiring non-standard devices.

BRIEF DESCRIPTION OF THE DRAWINGS

Preferred embodiments of the invention will now be described with reference to the attached drawings in which.

DETAILED DESCRIPTION OF THE PREFERRED EMBODIMENTS

Figure 1A:
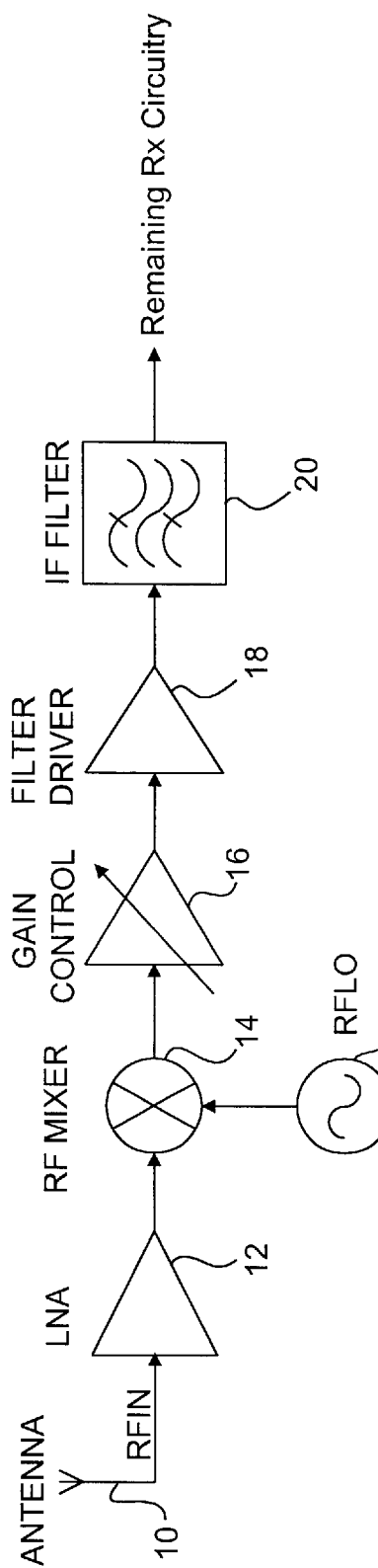
FIG. 1a is a block diagram of a typical receiver in which a gain control element is located close to the antenna.

Referring firstly to FIG. 1a, an example of a conventional receiver is shown consisting of, connected together in sequence, an antenna 10 through which is received an RF signal RFIN, an input amplifier 12 such as an LNA (low noise amplifier), an RF mixer 14, a gain control element 16, a filter driver 18, an IF filter 20, and additional receiver circuitry (not shown). An RFLO (RF local oscillator) 22 is connected to the RF mixer 14. In this example, the gain control element 16 is located before the IF filter 20, and as such, is difficult to design, as referred to above.

Figure 1B:
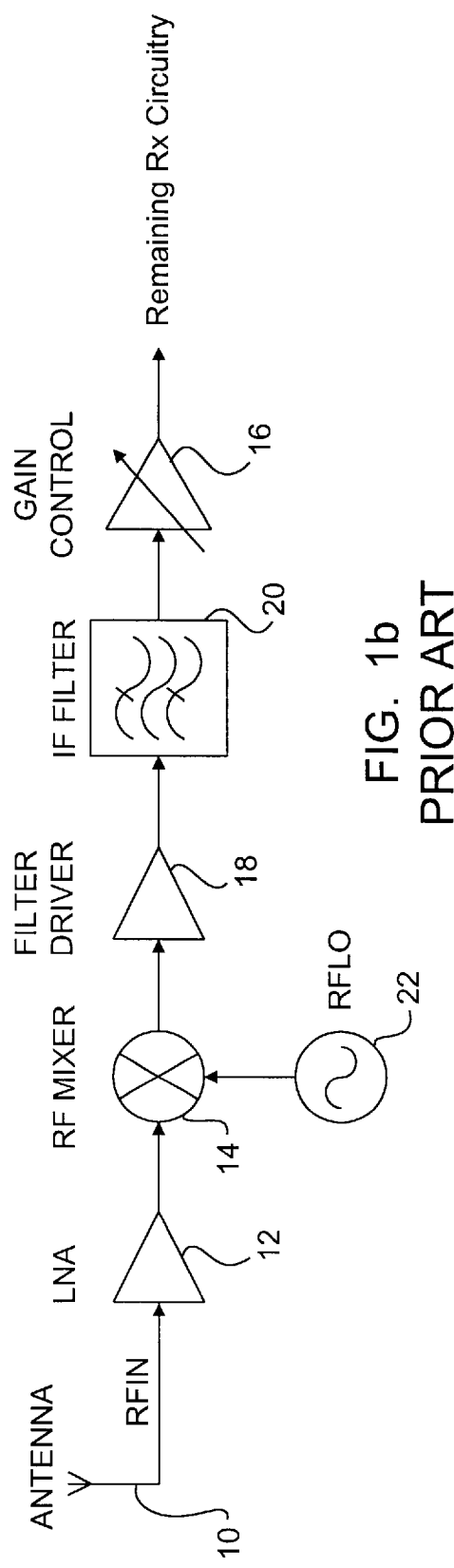
FIG. 1b is a block diagram of a typical receiver in which a gain control element is located after an IF filter.

Referring now to FIG. 1b, another example of a conventional receiver is shown consisting of, connected together in sequence, an antenna 10 through which is received an RF signal RFIN, an input amplifier 12 such as an LNA, an RF mixer 14 having an RFLO 22, a filter driver 18, an IF filter 20, a gain control element 16, and additional receiver circuitry (not shown). In this example, the gain control element 16 is located after the IF filter 20, and as such, all the elements located before the gain control element 16 including the IF filter 20 must be designed to handle signals having a large dynamic range, as referred to above.

Figure 2A:
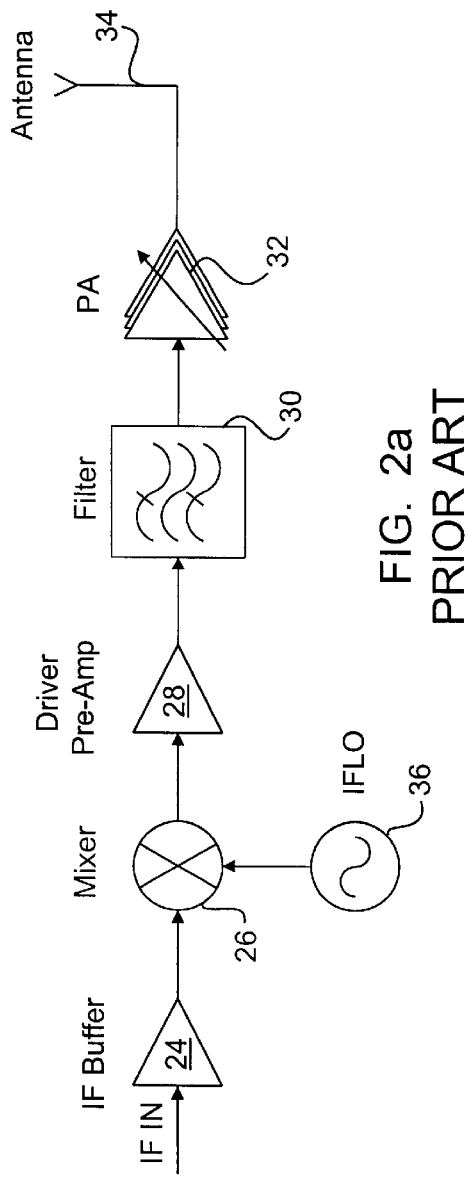
FIG. 2a is a block diagram of a typical transmitter in which a gain control element is located close to the antenna.

Referring now to FIG. 2a, an example of a conventional transmitter is shown consisting of, connected together in sequence, an IF buffer 24 to which is supplied an intermediate frequency signal IFIN, an IF mixer 26, a driver preamplifier 28, a filter 30 and a variable gain power amplifier 32 driving an antenna 34. An IFLO (IF local oscillator) 36 is connected to the mixer 26. In this example, the gain control element is the final power amplifier which, as indicated above, is difficult to design so as to maintain linearity and spectral purity of the signal over a wide range of transmit powers.

Figure 2B:
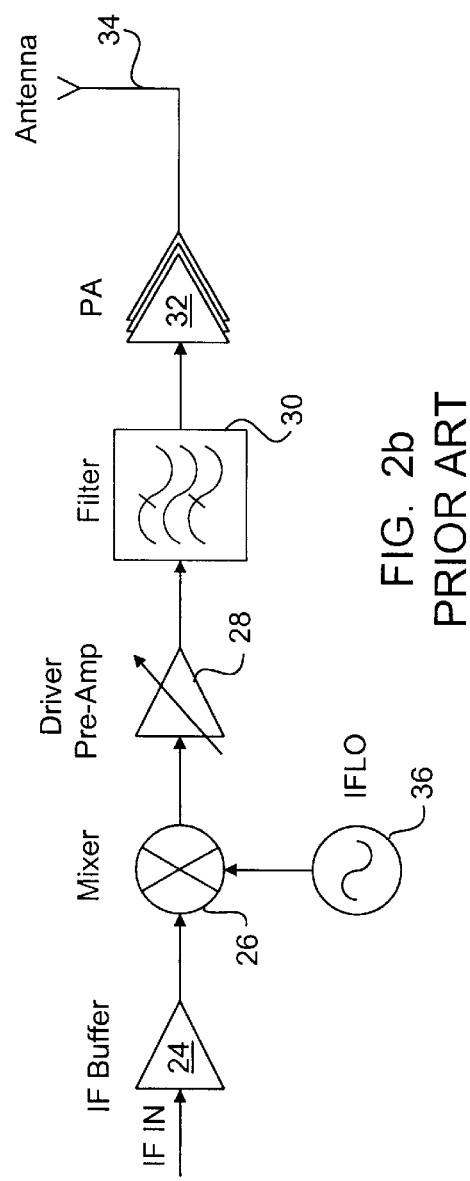
FIG. 2b is a block diagram of a typical transmitter in which a gain control element is located immediately after a mixer stage.

A similar problem is presented by the design illustrated in FIG. 2b in which the preamplifier rather than the final power amplifier is the gain control element.

Figure 2C:
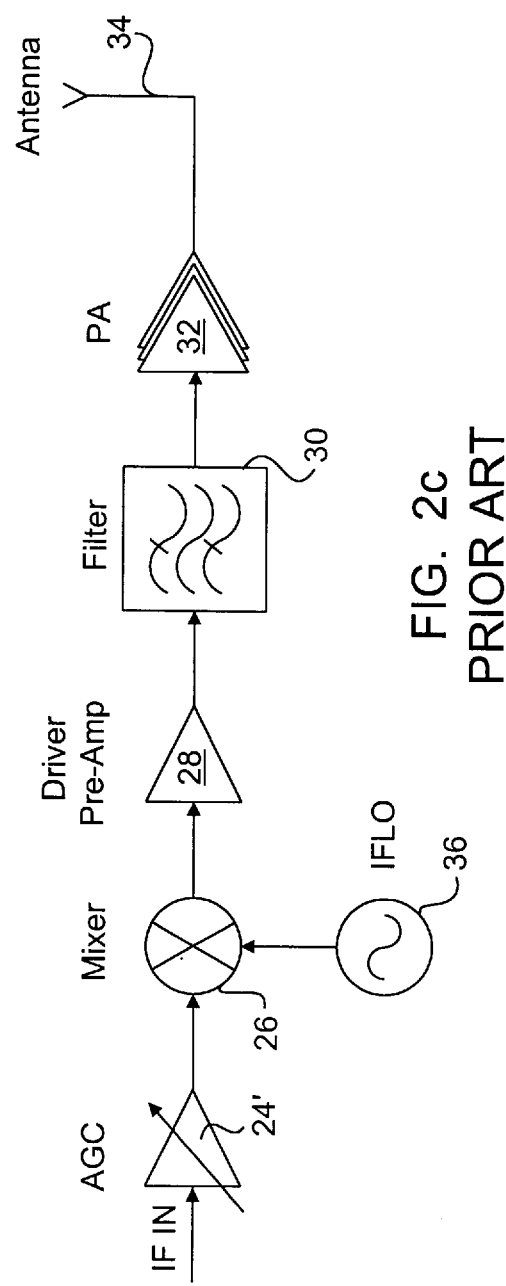
FIG. 2c is a block diagram of a typical transmitter in which a gain control element is located immediately before the mixer stage.

In FIG. 2c, the IF buffer is replaced with an AGC 24' which serves as the gain control element instead of the preamplifier of the final power amplifier. This topology requires increased design effort in or before the mixing stage as indicated above.

Figure 3:
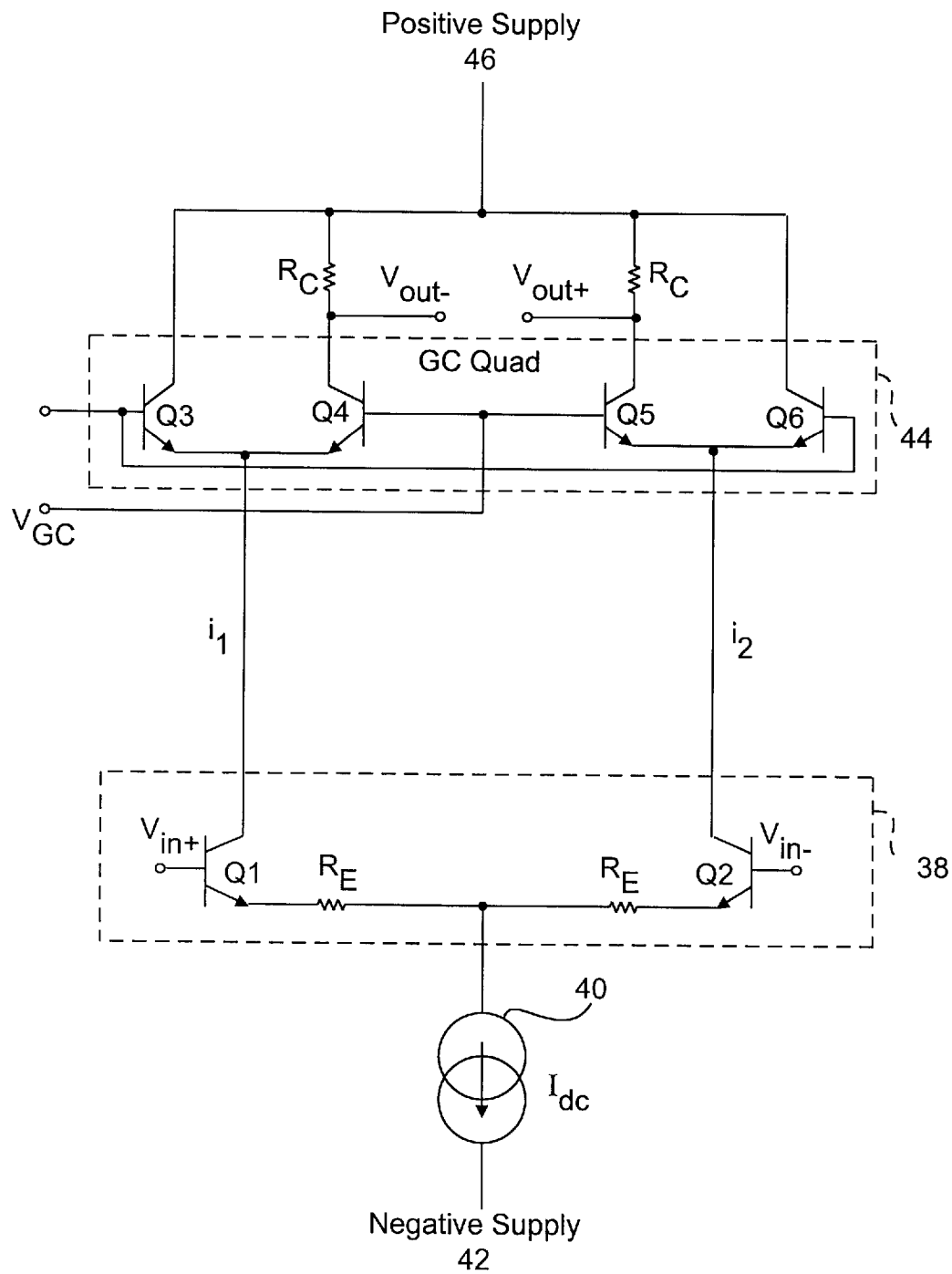
FIG. 3 is a schematic of a conventional variable gain controlled amplifier.

Referring now to FIG. 3, a conventional variable gain controlled amplifier will be described. This might be the gain control element 16 of FIGS. 1a and 1b for example. The variable gain controlled amplifier has an input stage which in the illustrated example is a differential pair 38 consisting of a pair of NPN transistors Q1, Q2 having emitters connected through respective resistances $R_E$ and a biasing current source 40 to a negative power supply 42. A differential voltage input signal is applied at terminals $V_{in+}$ and $V_{in-}$, $V_{in+}$ being connected to the base of transistor Q1 and $V_{in-}$ being connected to the base of transistor Q2. There is also a gain control stage which in the illustrated example is an upper GC (gain control) transistor quad 44 consisting of NPN transistors Q3, Q4, Q5, Q6 connected as two differential pairs Q3, Q4 and Q5, Q6. The emitters of transistors Q3, Q4 are connected together and to the collector of transistor Q1. Similarly, the emitters of transistors Q5, Q6 are connected together and to the collector of transistor Q2. The collectors of transistors Q4, Q5 are connected across respective load resistors $R_C$ to a positive power supply 46 while the collectors of transistors Q3, Q6 are connected directly to the positive power supply.

The input differential pair 38 converts the differential voltage input signal applied to terminals $V_{in+}$ and $V_{in-}$ into a differential current ($i_1$, $i_2$). The amount of signal current ($i_1$, $i_2$) directed to the load $R_C$ is controlled by the base bias on the upper transistor quad 44. Transistors Q3 and Q6 are grounding transistors which, when turned off, cause all of the signal current ($i_1$, $i_2$) to be directed into the load $R_C$. Transistors Q4 and Q5, when turned off, cause all of the signal current to pass directly to the positive supply (ac ground). A gain control input signal consisting of GC control voltage $V_{GC}$ is applied to the bases of the transistors of the upper transistor quad 44. A smooth transition in gain is obtained by varying $V_{GC}$ thereby controlling the amount of signal current that is diverted into the ac ground. The voltage gain $A_V$ produced by the variable gain controlled amplifier may be expressed by $$A_V = R_C/R_E[1/(1+\exp(V_{GC}/V_T))]$$

where $V_T$=KT/q; the "thermal voltage"

K=Boltzmann's constant=1.38×10$^{-23}$ Joules/Kelvin

T=the absolute temperature in Kelvins q=the magnitude of electronic charges=1.602×10$^{-19}$ coulomb.

Figure 4:
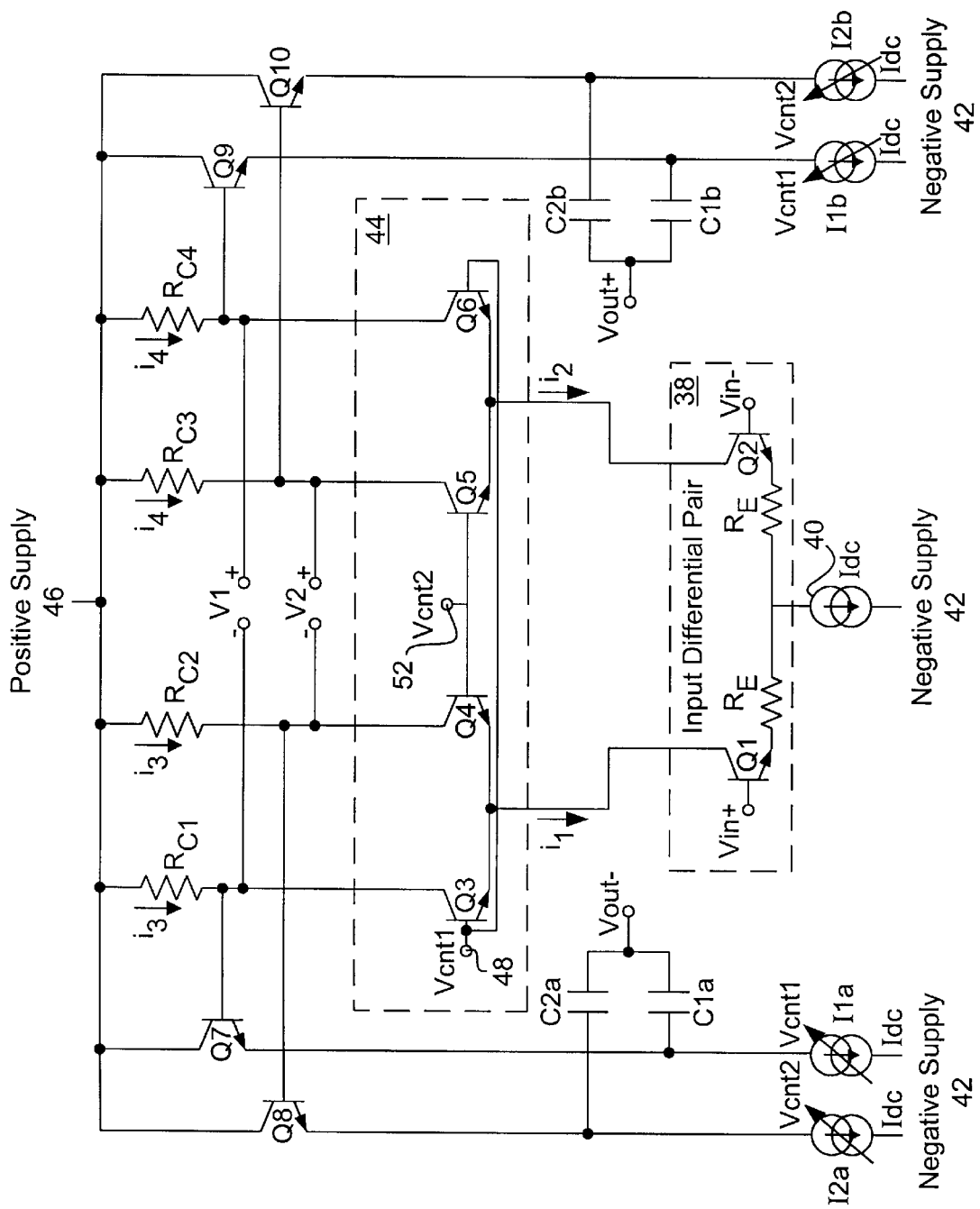
FIG. 4 is a schematic of a switched gain amplifier according to one embodiment of the invention.

Referring now to FIG. 4, a switched gain amplifier according to one embodiment of the invention will now be described. The switched gain amplifier includes an input differential pair 38 identical to the input differential pair 38 of FIG. 3 and connected through a constant current source 40 to the negative power supply 42. The input differential pair 38 is connected to an upper transistor quad 44 in a manner identical to that of FIG. 3. However, although the upper transistor quad 44 consists of four NPN transistors Q3, Q4, Q5 and Q6 interconnected in the same way as the transistors of upper quad 44 of FIG. 3, they are biased differently and operate as switches that are fully off or fully on.

A control terminal 48 is connected to the base of transistor Q3 and to the base of transistor Q6 and a control terminal 52 is connected to the base of transistor Q4 as well as the base of transistor Q5. A control voltage $V_{CNT1}$ may be applied to terminals 48 and a control voltage $V_{CNT2}$ may be applied to terminal 52.

Furthermore, the collector of each transistor Q3, Q4, Q5 and Q6 is connected through a respective load resistor $R_{C1}$, $R_{C2}$, $R_{C3}$ and $R_{C4}$ to the positive power supply. The resistance of $R_{C1}$ is equal to that of $R_{C4}$ and the resistance of $R_{C2}$ is equal to that of $R_{C3}$.

In addition, the collector of transistor Q3 is connected to the base of an NPN transistor Q7, the emitter of which is connected through a switchable current source 11a to the negative supply and the collector of which is connected to the positive supply. Similarly, the collector of transistor Q4 is connected to the base of an NPN transistor Q8, the emitter of which is connected through a switchable current source I2a to the negative supply and the collector of which is connected to the positive supply. In like fashion, the collector of transistor Q6 is connected to the base of an NPN transistor Q9, the emitter of which is connected through a switchable current source I1b to the negative supply and the collector of which is connected to the positive supply. Finally, the collector of transistor Q5 is connected to the base of an NPN transistor Q10, the emitter of which is connected through a switchable current source I2b to the negative supply and the collector of which is connected to the positive supply.

The emitter of transistor Q7 is connected through a capacitor C1a to a $V_{out-}$ terminal and the emitter of transistor Q8 is connected through a capacitor C2a to the $V_{out-}$ terminal. The emitter of transistor Q9 is connected through a capacitor C1b to a $V_{out+}$ terminal and the emitter of transistor Q10 is connected through a capacitor C2b to the $V_{out+}$ terminal.

In operation, as with the circuit of FIG. 3, the input signal voltage applied to the terminals $V_{in+}$ and $V_{in-}$ is transformed into a differential current by the lower differential pair 38. The signal and dc current are steered either through load resistors $R_{C1}$ and $R_{C4}$ on the one hand or through resistors $R_{C2}$ and $R_{C3}$ on the other hand. More particularly, if $V_{CNT1}>V_{CNT2}$, then loads $R_{C1}$ and $R_{C4}$ are selected. Conversely, if $V_{CNT1}<V_{CNT2}$, loads $R_{C2}$ and $R_{C3}$ are selected. If loads $R_{C1}$ and $R_{C4}$ are selected a voltage V1 is derived between the collectors of transistors Q3 and Q6. Alternatively, if loads $R_{C2}$ and $R_{C3}$ are selected a voltage V2 is derived between the collectors of transistors Q4 and Q5.

The voltage V1 or V2 is buffered by emitter follower connected transistors Q7 and Q9 or Q8 and Q10, respectively, which are selectively turned on or off by current sources I1a and I1b or I2a and I2b, respectively, depending on the desired gain state. More particularly, current sources I1a and I1b are switched on by $V_{CNT1}$ and I2a and I2b are switched on by $V_{CNT2}$. Thus, when V1 is selected the corresponding current sources I1a and I1b are on and V1 is obtained at the output and when V2 is selected the corresponding current sources I2a and I2b are switched on such that V2 is obtained at the output. The outputs from the emitter followers Q7 and Q8 are respectively connected through capacitors C1a and C2a to the $V_{out-}$ terminal and the outputs from the emitter followers Q9 and Q10 are respectively connected through capacitors C1b and C2b to the $V_{out+}$ terminal. In this way, voltage V1 is obtained across the $V_{out}$ terminals when $V_{CNT1}>V_{CNT2}$ giving a voltage gain $A_V=-R_{C1}/R_E$ and voltage V2 is obtained across the $V_{out}$ terminals when $V_{CNT1}<V_{CNT2}$ giving a voltage gain in that case $A_V=-R_{C2}/R_e$.

Figure 5:
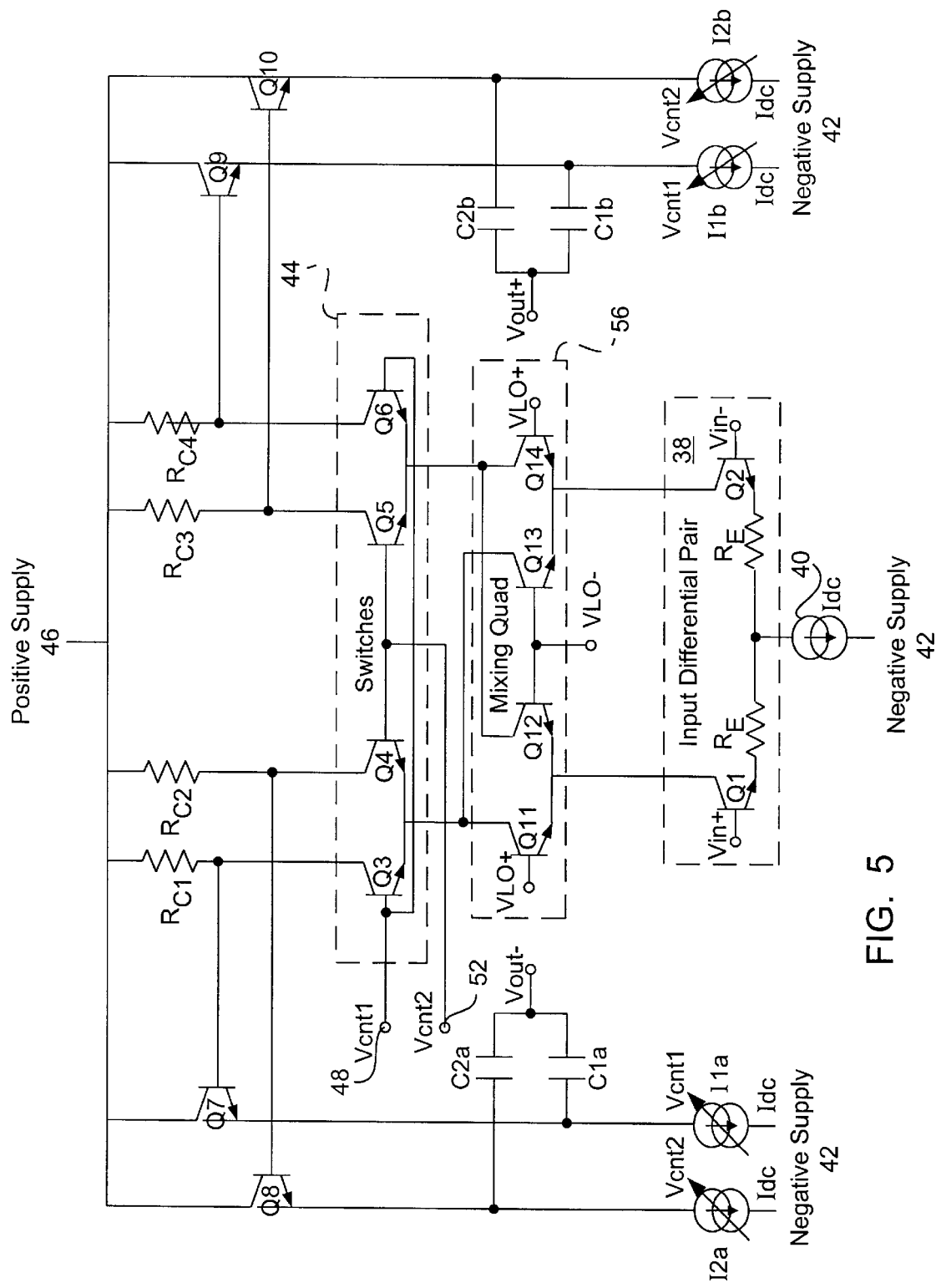
FIG. 5 is a schematic of a switched gain mixer according to another embodiment of the invention.

Although the invention has been described with reference to FIG. 4 which is an amplifier design, the inventive concept can be equally applied to other signal processing blocks that require a switched gain. For example, the invention may be embodied in a switched gain mixer as illustrated in FIG. 5. Referring to this Figure, a tree mixer, as is understood by one skilled in the art, conventionally includes an input differential pair 38 and constant current source 40 identical to the similarly numbered components in FIG. 3 or 4. In addition, conventionally the mixer includes a mixing quad 56 consisting of NPN transistors Q11, Q12, Q13, Q14 configured as two differential pairs Q11, Q12 and Q13, Q14. The emitters of transistors Q11, Q12 are connected together and to the collector of transistor Q1. Similarly, the emitters of transistors Q13, Q14 are connected together and to the collector of transistor Q2. Also, the collectors of transistors Q11 and Q13 are cross-connected and the collectors of transistors Q12 and Q14 are cross-connected. A mixing input signal, also referred to as an LO (local oscillator) signal consisting of a differential mixing voltage signal, is applied to the mixing quad through $V_{LO+}$ and $V_{LO-}$ terminals, the $V_{LO+}$ terminals being respectively connected to the bases of transistors Q11, Q12 and the $V_{LO-}$ terminal being connected to the bases of transistors Q12 and Q13.

Thus far described the mixer is entirely conventional. The signal resulting from mixing the differential input signal applied at the differential input pair via terminals $V_{in+}$ and $V_{in-}$ and the local oscillator signal applied in the mixing quad would normally be obtained between the collectors of transistors Q11 and Q14. However, according to the invention, these collectors are connected to an upper transistor switch quad 44 essentially identical to the upper transistor switch quad 44 of FIG. 4.

The collectors of the switching quad 46 are connected as previously described with reference to FIG. 4 to load resistors $R_{C1}$, $R_{C2}$, $R_{C3}$, $R_{C4}$, emitter follower transistors Q7, Q8, Q9, Q10, switchable current sources I1a, I2a, I1b, I2b and capacitors C1a, C2a, C1b and C2b connected to output terminals $V_{out-}$ and $V_{out+}$.

In operation with $R_{C1}=R_{C4}$ and $R_{C2}=R_{C3}$, if $V_{CNT1}>V_{CNT2}$ the gain is expressed as:

$$V_{out}=(-R_{C1}/R_E)\ (2/[\sin((W_L+W_R)t)+\sin((W_L-W_R)t)])$$

On the other hand, if $V_{CNT2}<V_{CNT1}$ this becomes $$V_{out}=(-R_{C2}/R_E)\ (2/[\sin((W_L+W_R)t)+\sin((W_L-W_R)t)])$$

Figure 6:
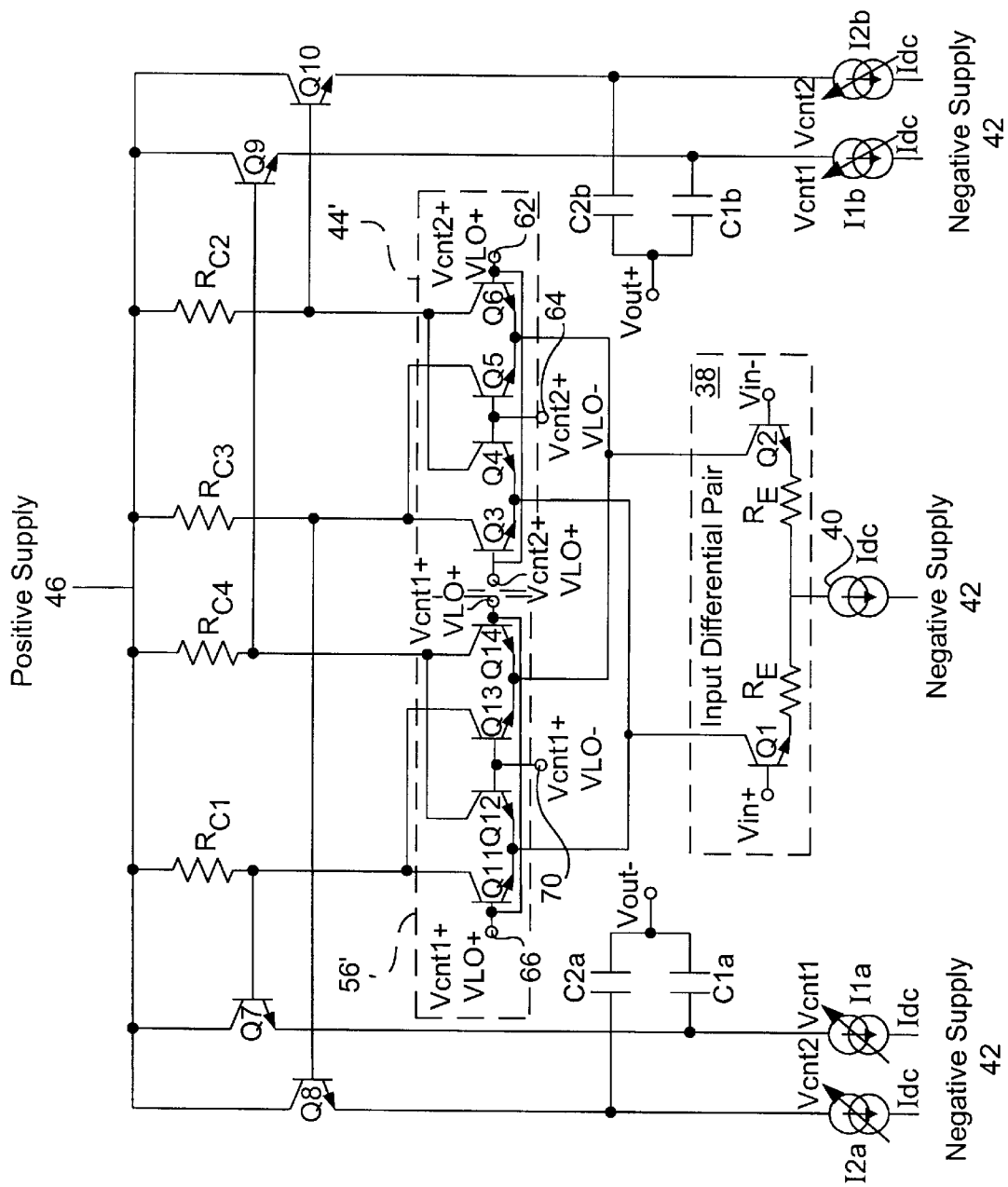
FIG. 6 is a schematic of a low voltage switched gain mixer according to yet another embodiment of the invention.

Turning now to FIG. 6, this shows a switched gain mixer according to the invention in which a lower voltage headroom is possible. The mixer is based on the same principles as that of FIG. 5 but, instead of the upper switch quad 44 following the mixing quad 56, the two quads are merged to form two combined switch and mixing quads 44', 56' which run essentially in parallel between the input differential pair 38 and the load resistors $R_{C1}$, $R_{C2}$, $R_{C3}$, $R_{C4}$. More specifically, the two cross-coupled collector pairs of the combined switch and mixing quad 56' are connected respectively to load resistors $R_{C1}$ and $R_{C4}$ while, as before, the two coupled emitter pairs are respectively connected to different transistors Q1, Q2 of the input differential pair 38. Additionally, combined switch and mixing quad 44' has its collectors cross-coupled in the same way as the quad 56' and the two cross-coupled collector pairs are respectively connected to load resistors $R_{C3}$ and $R_{C4}$ while the two coupled emitter pairs are respectively connected to different transistors Q1, Q2 of the input differential pairs.

With particular regard to the load resistors, note $R_{C1}$ is connected to the cross-coupled collectors of transistors Q11 and Q13, $R_{C4}$ is connected to the cross-coupled collectors of transistors Q12 and Q14, $R_{C3}$ is connected to the cross-coupled collectors of transistors Q3 and Q5 and $R_{C2}$ is connected to the cross-coupled collectors of transistors Q5 and Q6. Moreover, the cross-coupled collectors of transistors Q11 and Q13 are connected to the base of emitter follower transistor Q7, the cross-coupled collectors of transistors Q3 and Q5 are connected to the base of emitter follower transistor Q8, the cross-coupled collectors of transistors Q12 and Q14 are connected to the base of emitter follower transistor Q9 and the cross-coupled collectors of transistors Q4 and Q6 are connected to the base of emitter follower transistor Q10.

Switchable current sources I1a, I2a, I1b, I2b and capacitors C1a, C2a, C1b, C2b are connected as in FIG. 5. However, instead of having separate terminals for the application of local oscillator signal VLO and the control voltages $V_{CNT1}$, $V_{CNT2}$, those voltages are superimposed. More specifically, quad 44' has an input terminal 62 connected to the base of transistor Q3 and connected to the base of transistor Q6 and an input terminal 64 connected to the base of transistors Q4 and Q5. $V_{CNT2}$ and $V_{LO+}$ are applied to terminal 60 and $V_{CNT2}$ and $V_{LO-}$ are applied to terminal 64.

Additionally, quad 56' has an input terminal 66 connected to the base of transistor Q11 and connected to the base of transistor Q14 and an input terminal 70 connected to the bases of transistors Q12 and Q13.

In operation, the circuit of FIG. 6 provides the same gains as explained with reference to FIG. 5 for the case where $V_{CNT1} > V_{CNT2}$ and vice versa. This is achieved by the control voltages switching on Q3, Q4, Q5 and Q6 or switching on Q11, Q12, Q13 and Q14, respectively. In this embodiment, we have reduced the number of NPN transistors connected in series between the positive and negative supplies. This provides increased voltage headroom allowing an increase in the permitted signal size before distortion or a reduction of the voltage supply levels.

Figure 7:
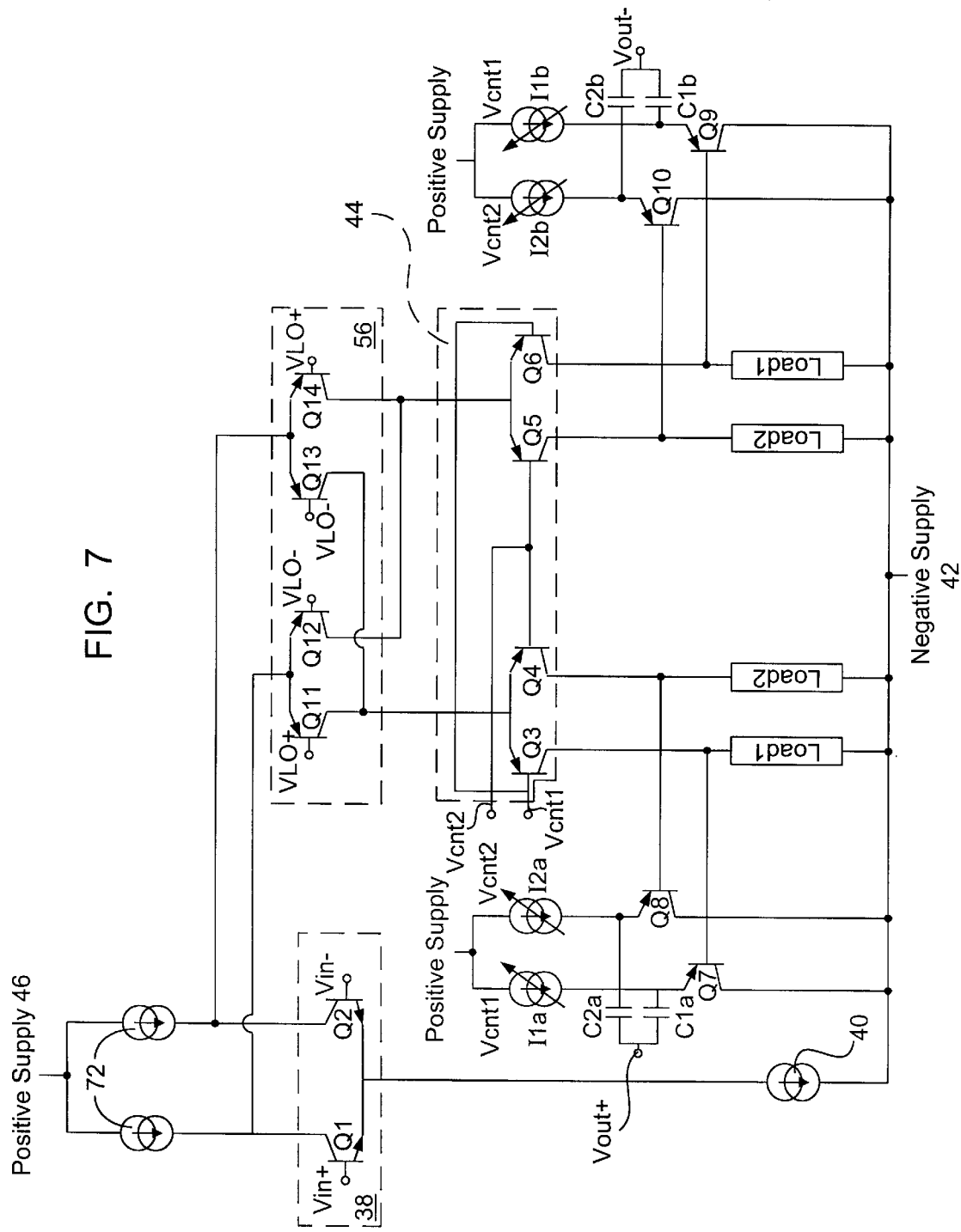
FIG. 7 is a schematic of a folded switched gain mixer according to still another embodiment of the invention.

Increased voltage headroom between the positive and negative supplies can also be achieved by using a folded circuit configuration as illustrated in FIG. 7. This circuit is constructed using PNP transistors instead of NPN transistors but the operation of the circuit is essentially identical to that of FIG. 5. The difference in configuration is that the input differential pair 36 is not connected in series with mixing quad 56 and switch quad 44 between the positive and negative supply rails. Instead, the input differential pair and constant circuit source 40 are connected in series with additional constant current sources 72 between the supply rails and additionally the mixing quad is connected in series with the switch quad between the supply rails. Again, as in the case of FIG. 6, the headroom is increased by the removal of one transistor, permitting increased signal handling capabilities or a reduction in supply levels. Incidentally, constant current sources 40, 72 could each be replaced with a parallel inductor/capacitor tank circuit to provide increased headroom or a frequency selective circuit.

Figure 10:
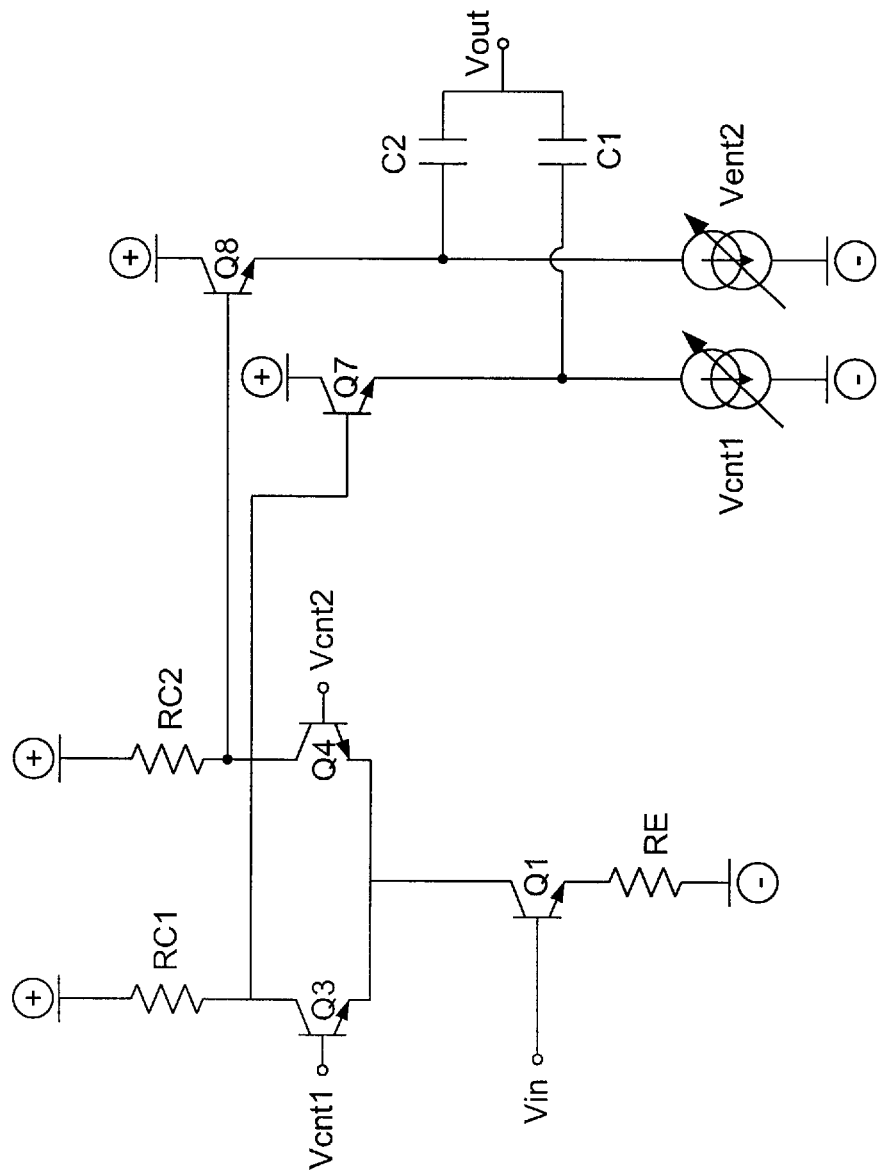
FIG. 10 is a diagram similar to FIG. 4 but illustrating a single ended version of the invention.

FIG. 10 illustrates the invention as applied to a single sided input stage switched gain amplifier. It can be seen that this circuit is similar to that of FIG. 4 except that, because the input signal $V_{in}$ is not a differential signal, there is a single input transistor Q1 and a single pair of transistors Q3 and Q4 instead of a quad. This means also that there are only two load resistors and only two buffer transistors Q7, Q8, two switchable current sources and input capacitors. The circuitry of FIGS. 5, 6 and 7 can similarly be translated to a single ended input configuration.

Figure 8A:
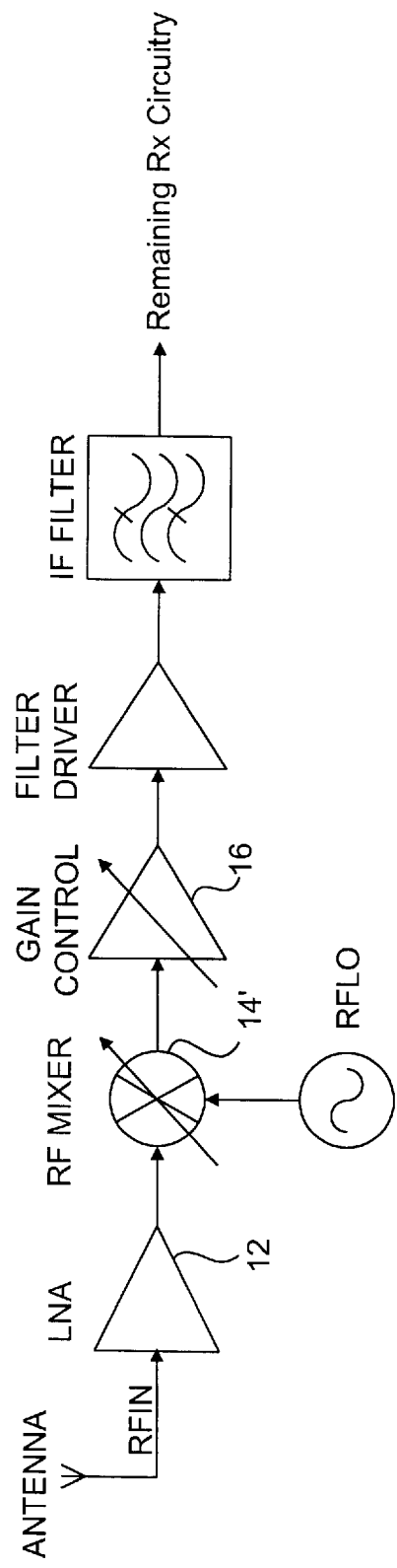
FIGS. 8a and 8b are block diagrams of a receiver illustrating how a switched gain element of the invention may be incorporated in the receiver.
Figure 8B:
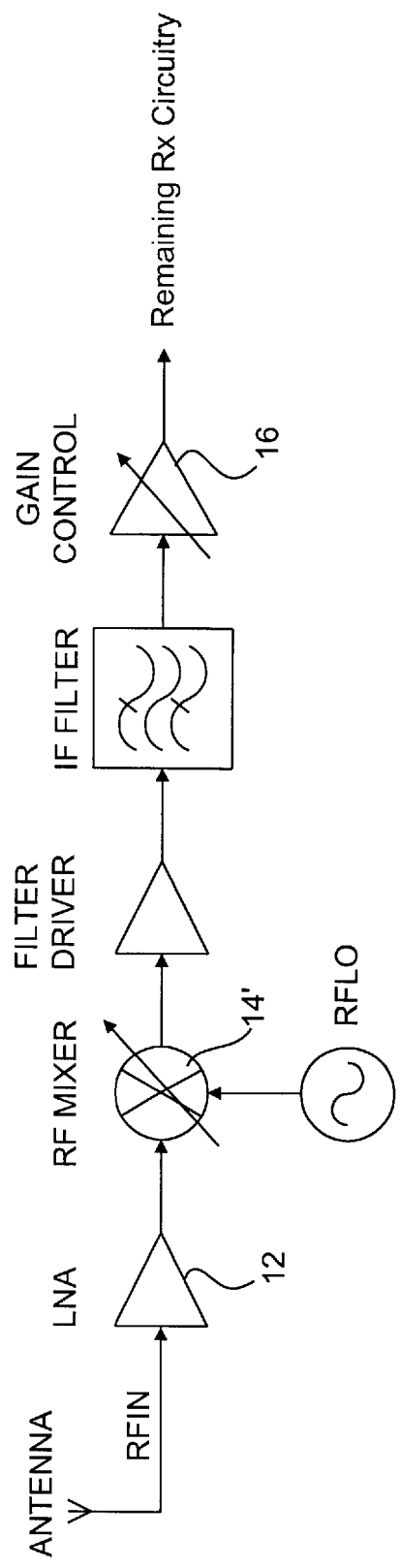
Figure 9:
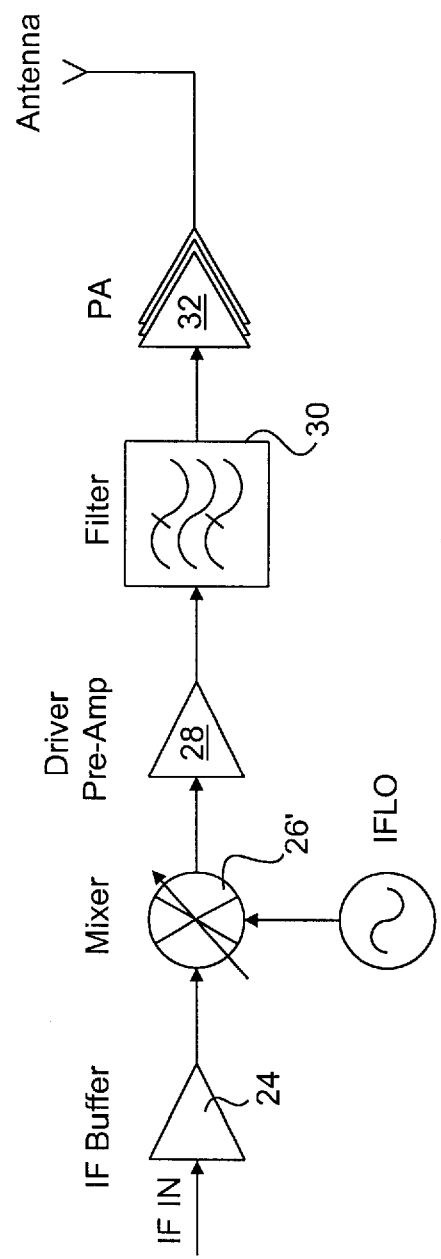
FIG. 9 is a block diagram of a transmitter illustrating how a switched gain element of the invention may be incorporated in the transmitter.

FIGS. 8 and 9 illustrate typical implementations of the inventive switched gain element. Referring to FIGS. 8a and b, two receiver circuits essentially identical to FIGS. 1a and 1b are shown except that the conventional RF mixer is replaced with a switched gain mixer 14'. This permits a coarse central operation point to be provided by the switched gain mixer 14' around which the most linear region of gain control element 16 can be used for fine range gain control. This avoids problems in the conventional receiver arising from the fact that only a small portion of the tuning range of the gain control element 16 is linear.

FIG. 9 illustrates a transmitter using the switched gain mixer 26' of the invention instead of the conventional mixer 26 of FIG. 2. In addition, none of the other amplifying elements need be gain controllable unlike FIG. 2. This arrangement in which frequency translation and gain control functions are merged provides a very compact power efficient circuit which allows for well-defined, user-selectable conversion gains. This circuit can be used in either the transmitter or the receiver providing flexibility as well as enhanced performance with reduced power usage.

Numerous modifications and variations of the present invention are possible in the light of the above teachings. It is therefore to be understood that within the scope of the appended claims the invention may be practised otherwise as specifically described.

For example, the invention may be implemented other than with the use of BJT's (bipolar junction transistors) and may be implemented instead using CMOS (complementary metal oxide semiconductor) technology.

Additionally, although pure resistors are shown for collector loads $R_C$ and emitter degeneration $R_E$, it should be understood that the invention will work equally well if these elements are complex impedances rather than pure resistors.

Figure 11:
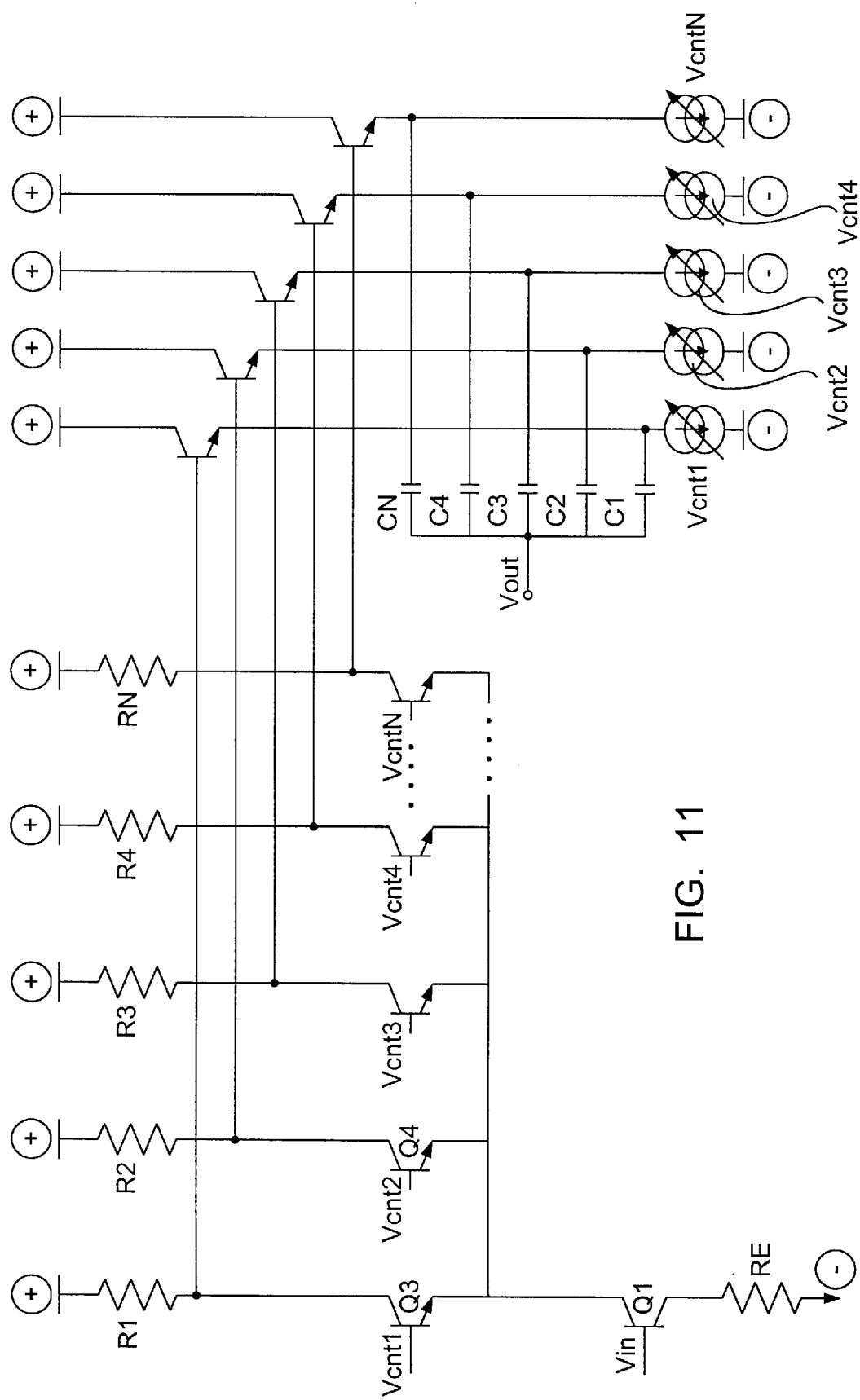
FIG. 11 is a diagram similar to FIG. 10 but illustrating more particularly how additional gain steps may be obtained by adding load impedances.

Furthermore, although only two selectable load impedance values have been provided in the embodiments described, this is only for ease of description. There may be as many selectable load impedance values as required. FIG. 11 illustrates the way in which additional impedances are added to the single-ended switched gain element of FIG. 10. For each additional switch step required an additional transistor is connected in parallel with transistors Q3 and Q4 with the emitter of each additional transistor connected to the collector of transistor Q1 of the input stage and with the collector of each additional transistor connected through an additional load impedance to the positive supply source. A different control voltage is applied to the base of each additional transistor and, of course, each additional transistor is connected to its own buffer transistor, switchable current source and output capacitor.

The same principles apply to expanding the switch steps of the gain elements of FIGS. 4 to 8 either as differential or single-ended circuits. For example, considering the differential switched gain mixer of FIG. 5, additional switch steps would be achieved by adding successively two transistors to the switch block 44, one of the two additional transistors being connected in parallel with transistors Q3 and Q4 and the other in parallel with transistors Q5 and Q6. Each of the additional transistors would be connected to an equal value load impedance and each would have an associated buffer transistor, switchable current source and output capacitor.

Figure 12:
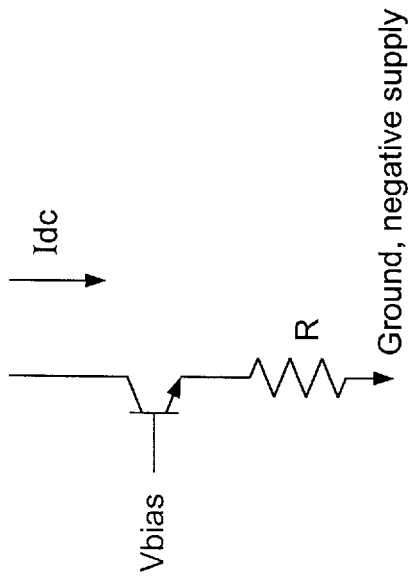
FIG. 12 is a schematic view of a typical current source.

The current sources 40, 72 and the switchable current sources I1a, I2a etc., could be implemented in different ways as known in the art. For example, FIG. 12 illustrates a typical current source which consists of an NPN transistor having its emitter connected through a resistor to the negative supply and a DC bias voltage $V_{bias}$ applied to its base. A constant DC current source is obtained by keeping $V_{bias}$ constant.

Figure 13:
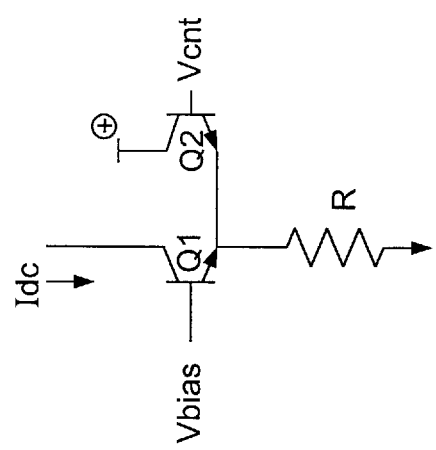
FIG. 13 is a schematic view of a typical switchable current source.

If $V_{bias}$ is varied between two extremes, one above and one below a threshold, a switchable current source is obtained in which when $V_{bias}$ is below the threshold the output current is zero and when $V_{bias}$ is raised above the threshold the desired DC current is obtained. The need to change the bias voltage can be avoided using the circuit of FIG. 13 in which a second NPN transistor is added with its emitter connected to the emitter of the first transistor, its collector connected to a positive supply voltage and its base connected to a switch voltage such as $V_{CNT1}$ or $V_{CNT2}$ etc. This improves accuracy and stability.

We claim:

1. A switched gain element comprising an input stage for receiving an input signal and a gain control stage connected to the input stage, the gain control stage comprising:

at least one plurality of switch transistors connected respectively to a plurality of load impedance of different values;

the switch transistors having respective control terminals whereby application of predetermined respective control voltages to the control terminals causes selectively a predetermined one of the plurality of switch transistors to conduct thereby causing a voltage dependent on the respective impedance to be derived at an output of the predetermined switch transistor, the outputs of the plurality of switch transistors being connected through respective buffer switches to an output terminal, the buffer switches being switchable by the respective control voltages whereby the derived voltage is applied to the output terminal.

2. A switched gain element according to claim 1, wherein each buffer switch comprises a transistor having a first electrode connected to a respective one of the plurality of load impedances, a second electrode connected to a bias voltage source and a third electrode connected through a respective capacitor to the output terminal, the third electrode also being connected to a respective current source switchable by the respective control voltage.

3. A switched gain element according to claim 2, wherein the input stage is a single balanced input stage comprising a single transistor having a first input electrode, a second electrode connected through a degeneration resistor to a current source, and a third electrode, and wherein the plurality of switch transistors each have a first control electrode, a second electrode connected to the respective load impedance and a third electrode connected in common with the other third electrodes to the third electrode of the single transistor of the input stage.

4. A switched gain element according to claim 3, wherein the single transistor of the input stage is an NPN transistor with the first, second and third electrodes respectively being a base, an emitter and a collector and wherein the transistors of the gain control stage are NPN transistors with the first, second and third electrodes respectively being a base, a collector and an emitter.

5. A switched gain element according to claim 4, wherein the transistors of the buffer switches are NPN transistors connected together as emitter followers and each having a base connected to a junction of a respective collector of the plurality of switch transistors and the respective impedance and each having an emitter connected to a respective one of the switchable current sources and connected to the output terminal through the respective capacitor.

6. A switched gain element according to claim 2, wherein the input stage is a differential input stage comprising a differential pair of transistors each having a first input electrode, a second electrode connected through a degeneration resistor to a common constant current source and a third electrode, and the gain control stage comprises two pluralities of switch transistors, two corresponding pluralities of load impedances and two corresponding pluralities of buffer switches connected to two respective output terminals, one plurality of switch transistors being connected to the third electrode of one of the transistors of the input stage and the other plurality of switch transistors being connected to the third electrode of the other of the transistors of the input stage, the switch transistors of one plurality of switch transistors being paired with the switch transistors of the other plurality of switch transistors by connecting control electrodes of each pair in common to a respective one of the control terminals and by connecting the transistors of each pair to an equal value impedance of the respective plurality of load impedances.

7. A switched gain element according to claim 6, wherein the transistors of the input stage are NPN transistors with the first, second and third electrodes respectively being a base, an emitter and a collector and wherein the transistors of the gain control stage are NPN transistors each having a base which is the control electrode, a collector connected to the respective load impedance and an emitter connected to the collector of a respective one of the transistors of the input stage.

8. A switched gain element according to claim 7, wherein the transistors of the buffer switches are NPN transistors connected together as emitter followers and each having a base connected to a junction of a respective collector of the plurality of switch transistors and the respective impedance and each having an emitter connected to a respective one of the switchable current sources and connected to the respective output terminal through the respective capacitor.

9. A switched gain element according to claim 2, wherein each switchable current source comprises a pair of transistors one of which is configured as a constant current source and the other of which has a control electrode arranged to receive the respective control voltage thereby to switch on the constant current source.

10. A switched gain element according to claim 9, wherein the input stage is a single balanced input stage comprising a single transistor having a first input electrode, a second electrode connected through a degeneration resistor to a current source, and a third electrode, and wherein the plurality of switch transistors each have a first control electrode, a second electrode connected to the respective load impedance and a third electrode connected in common with the other third electrodes to the third electrode of the single transistor of the input stage.

11. A switched gain element according to claim 10, wherein the single transistor of the input stage is an NPN transistor with the first, second and third electrodes respectively being a base, an emitter and a collector and wherein the transistors of the gain control stage are NPN transistors with the first, second and third electrodes respectively being a base, a collector and an emitter.

12. A switched gain element according to claim 11, wherein the transistors of the buffer switches are NPN transistors connected together as emitter followers and each having a base connected to a junction of a respective collector of the plurality of switch transistors and the respective impedance and each having an emitter connected to a respective one of the switchable current sources and connected to the output terminal through the respective capacitor.

13. A switched gain element according to claim 9, wherein the input stage is a differential input stage comprising a differential pair of transistors each having a first input electrode, a second electrode connected through a degeneration resistor to a common constant current source and a third electrode, and the gain control stage comprises two pluralities of switch transistors, two corresponding pluralities of load impedances and two corresponding pluralities of buffer switches connected to two respective output terminals, one plurality of switch transistors being connected to the third electrode of one of the transistors of the input stage and the other plurality of switch transistors being connected to the third electrode of the other of the transistors of the input stage, the switch transistors of one plurality of switch transistors being paired with the switch transistors of the other plurality of switch transistors by connecting control electrodes of each pair in common to a respective one of the control terminals and by connecting the transistors of each pair to an equal value impedance of the respective plurality of load impedances.

14. A switched gain element according to claim 13, wherein the transistors of the input stage are NPN transistors with the first, second and third electrodes respectively being a base, an emitter and a collector and wherein the transistors of the gain control stage are NPN transistors having a base which is the control electrode, a collector connected to the respective load impedance and an emitter connected to the collector of a respective one of the transistors of the input stage.

15. A switched gain element according to claim 14, wherein the transistors of the buffer switches are NPN transistors connected together as emitter followers and each having a base connected to a junction of a respective collector of the plurality of switch transistors and the respective impedance and each having an emitter connected to a respective one of the switchable current sources and connected to the respective output terminal through the respective capacitor.

16. A switched gain element according to claim 1, wherein the input stage is a single balanced input stage comprising a single transistor having a first input electrode, a second electrode connected through a degeneration resistor to a current source, and a third electrode, and wherein the plurality of switch transistors each have a first control electrode, a second electrode connected to the respective load impedance and a third electrode connected in common with the other third electrodes to the third electrode of the single transistor of the input stage.

17. A switched gain element according to claim 16, wherein the single transistor of the input stage is an NPN transistor with the first, second and third electrodes respectively being a base, an emitter and a collector and wherein the transistors of the gain control stage are NPN transistors with the first, second and third electrodes respectively being a base, a collector and an emitter.

18. A switched gain element according to claim 1, wherein the input stage is a differential input stage comprising a differential pair of transistors each having a first input electrode, a second electrode connected through a degeneration resistor to a common constant current source and a third electrode, and the gain control stage comprises two pluralities of switch transistors, two corresponding pluralities of load impedances and two corresponding pluralities of buffer switches connected to two respective output terminals, one plurality of switch transistors being connected to the third electrode of one of the transistors of the input stage and the other plurality of switch transistors being connected to the third electrode of the other of the transistors of the input stage, the switch transistors of one plurality of switch transistors being paired with the switch transistors of the other plurality of switch transistors by connecting control electrodes of each pair in common to a respective one of the control terminals and by connecting the transistors of each pair to an equal value impedance of the respective plurality of load impedances.

19. A switched gain element according to claim 18, wherein the transistors of the input stage are NPN transistors with the first, second and third electrodes respectively being a base, an emitter and a collector and wherein the transistors of the gain control stage are NPN transistors each having a base which is the control electrode, a collector connected to the respective load impedance and an emitter connected to the collector of a respective one of the transistors of the input stage.

20. A switched gain mixer comprising a switched gain element according to claim 1, further comprising a mixing stage interposed between the input stage and the gain control stage, the mixing stage having an input for reception of a mixing signal to be mixed with the input signal.

21. A switched gain mixer according to claim 20, wherein each buffer switch comprises a transistor having a first electrode connected to a respective one of the plurality of load impedances, a second electrode connected to a bias voltage source and a third electrode connected through a respective capacitor to the output terminal, the third electrode also being connected to a respective current source switchable by the respective control voltage.

22. A switched gain mixer according to claim 21, wherein each switchable current source comprises a pair of transistors one of which is configured as a constant current source and the other of which has a control electrode arranged to receive the respective control voltage thereby to switch on the constant current source.

23. A switched gain mixer comprising a switched gain element according to claim 1, wherein the gain control stage is combined with a mixing stage and further comprises a second plurality of switch transistors, a further plurality of load impedances and a further plurality of buffer switches, and a further output terminal, the transistors of the first plurality being paired with the transistors of the second plurality by connecting control electrodes of each pair to a pair of control terminals upon which is impressed a respective control voltage superimposed on a mixing signal.

* * * * *